(12) United States Patent
Park et al.

(10) Patent No.: US 8,440,991 B2
(45) Date of Patent: May 14, 2013

(54) PHASE CHANGE MEMORY DEVICE HAVING A HEATER WITH A TEMPERATURE DEPENDENT RESISTIVITY, METHOD OF MANUFACTURING THE SAME, AND CIRCUIT OF THE SAME

(75) Inventors: Hae Chan Park, Gyeonggi-do (KR); Se Ho Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 114 days.

(21) Appl. No.: 12/647,193

(22) Filed: Dec. 24, 2009

(65) Prior Publication Data

US 2011/0073829 A1    Mar. 31, 2011

(30) Foreign Application Priority Data

Sep. 30, 2009    (KR) .................. 10-2009-0093601

(51) Int. Cl.
*H01L 21/283*    (2006.01)

(52) U.S. Cl.
USPC ............ 257/4; 257/40; 257/42; 257/E29.087; 257/E45.002; 257/E21.068

(58) Field of Classification Search .............. 257/4, 42, 257/E45.002, E29.087, E21.159, E21.068
See application file for complete search history.

(56) References Cited

U.S. PATENT DOCUMENTS

2004/0188668 A1*    9/2004    Hamann et al. .................. 257/2
2007/0076486 A1*    4/2007    Jeong et al. .............. 365/185.22
2008/0191187 A1*    8/2008    Lung et al. ........................ 257/4
2009/0015369 A1*    1/2009    Takeda et al. ................. 338/307
2009/0153826 A1*    6/2009    Sewell et al. ................... 355/67
2009/0239382 A1*    9/2009    Zhu ................................ 438/696

FOREIGN PATENT DOCUMENTS

| KR | 1020060007224 A | 1/2006 |
| KR | 1020060012168 A | 2/2006 |
| KR | 1020060059649 A | 6/2006 |
| KR | 1020060068546 A | 6/2006 |

OTHER PUBLICATIONS

Anna Malmros, et al; "Combined TiN- and TaN temperature compensated thin film resistors", Thin Solid Films vol. 520, Issue 6, Jan. 1, 2012, pp. 2162-2165.

"The Thermistor" 6 pages; downloaded from http://omega.com; info@omega.com ; Stamford, CT. 06907 (1-888-826-6242).

* cited by examiner

*Primary Examiner* — Mamadou Diallo
(74) *Attorney, Agent, or Firm* — Ladas & Parry LLP (57) ABSTRACT

A phase change memory device having a heater that exhibits a temperature dependent resistivity which provides a way of reducing a reset current is presented. The phase change memory device includes a phase change pattern and a heating electrode contacted with the phase change pattern. The heating electrode includes a smart heating electrode such that the smart heating layer is formed of a conduction material that exhibits an increase in resistance as a function of an increase in temperature, i.e., a positive temperature dependent resistivity.

15 Claims, 5 Drawing Sheets

PHASE CHANGE MEMORY DEVICE HAVING A HEATER WITH A TEMPERATURE DEPENDENT RESISTIVITY, METHOD OF MANUFACTURING THE SAME, AND CIRCUIT OF THE SAME

CROSS-REFERENCES TO RELATED APPLICATION

The present application claims priority under 35 U.S.C. 119(a) to Korean application number 10-2009-0093601, filed on Sep. 30, 2009, in the Korean Patent Office, which is incorporated by reference in its entirety as if set forth in full.

BACKGROUND OF THE INVENTION

1. Technical Field

The inventive concept relates to a nonvolatile semiconductor memory devices and, more particularly, to a phase change memory device capable of reducing a reset current, a method of manufacturing the same and a circuit of the same.

2. Related Art

Memory devices are classified into a volatile and non-volatile memory devices. Volatile memory devices include random access memory (RAM) devices which lose data stored therein when power is turned off. Non-volatile memory devices include read only memory (ROM) devices which retain stored data therein when power is turned off. Typically, dynamic random access memory (DRAM) devices and static random access memory (SRAM) devices are regarded as RAMs and flash memory devices is regarded as the ROMs.

As is well known, DRAMs consume low amounts of power and provide simple random access. However, DRAMs exhibit a volatile property and require an increase in the capacity of a capacitor due to high charge storage demands. Meanwhile, SRAMs which are used as cache memories provide random access and high operation speeds. However SRAMs exhibit a volatile property as well as high fabrication cost limit their availability and they require a relatively large size. Flash memory devices are also non-volatile. Due to the two-layered stack gate structure, flash memory devices require operation voltages that are higher than their respective power voltages. Accordingly flash memory devices require separate voltage boosting circuits for generating the desired program voltages and erase voltages. As such, flash memory devices are difficult to integrate and they operate at slow speeds.

To address some of the above problems, ferroelectric random access memory (FRAM) devices, a magnetic random access memory (MRAM) devices and a phase change random access memory (PRAM) devices have been investigated as possible alternative storage medium schemes.

Figure 1:
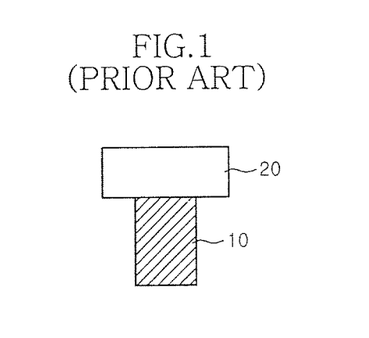
FIG. 1 is a sectional view of a heating electrode and a phase change pattern in a conventional phase change memory device.
Figure 2:
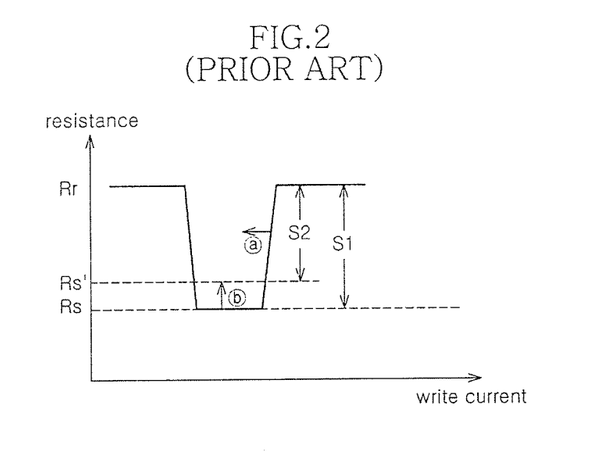
FIG. 2 is a graph showing a resistance of a phase change pattern to a write current in the conventional phase change memory device.

Among these new alternative memory devices, PRAMs use phase change materials as storage media which has a higher resistance in an amorphous state than in a more ordered crystalline state. PRAMs promise to provide faster operation speed and higher integrity as compared with the flash memory device. Typically, the phase change material may be a chalcogenide (GST)-based material which performs memory operation depending to the distinctly different solid state phases As shown in FIG. 1, PRAMs can include heating electrode 10 positioned below a phase change material 20 to induce heating, via a Joule heating phenomenon, of the phase change material so that resistance deformation of the phase change material can be reversibly performed. Since the higher temperature than the melting point of the phase change material should be applied to the phase change material of the PRAM so as drive the phase change transition of the phase change material 20 from a set state (a low resistance state corresponds to an ordered crystalline solid state) to a reset state (a high resistance state corresponds to a disordered amorphous solid state), a relatively high reset current is needed as shown in FIG. 2. According, higher power consumption is needed to achieve an adequate reset current.

Typically, a heating electrode 10 is chosen to be composed of a high resistive material so as to generate a large amount of heat, as well as, to reduce the requisite amount of current needed in the reset operation. That is, the amount of current is reduced in the ⓐ direction in the prior art. However, if the heating electrode 10 is formed of a high resistive material, the resistance of the heating electrode 10 is affected to the effective resistance of the phase change material 20 such that the resistance of the phase change material 20 in a set state is increased (ⓑ). Due to this, the non-ideal sensing margin S2 is shown to be the difference between the set resistance Rs' and the reset resistance Rr in which S2 is reduced as compared with the ideal sensing margin S1 in an ideal state, and thereby causing error in read of data. The ideal sensing margin S1 is defined as the difference between the ideal set resistance Rs and the reset resistance Rr.

SUMMARY

According to one aspect of an exemplary embodiment, a phase change memory device includes a phase change pattern and a heating electrode contacted with the phase change pattern and including a smart heating layer. The smart heating layer may be formed of a conductive material that a resistivity is increased in proportion to a temperature.

According to another aspect of another exemplary embodiment, a phase change memory device includes a semiconductor substrate, an interlayer insulating layer formed on the semiconductor substrate and having a contact hole, a heating electrode buried in the contact hole and including a thermistor material of a positive temperature coefficient (PTC) that a resistivity is increased relative to an increase of a temperature, and a phase change pattern contacted with an upper surface of the heating electrode.

According to still another aspect of another exemplary embodiment, there is provided a method of manufacturing a phase change memory device. First, an interlayer insulating layer having a contact hole is formed on a semiconductor substrate. A heating electrode is formed within the contact hole and includes a smart heating layer that a resistivity is increased in proportion to a temperature. Subsequently, a phase change pattern is formed on the heating electrode.

According to still another aspect of another exemplary embodiment, there is provided a method of manufacturing a phase change memory device. First, an interlayer insulating layer is formed on a semiconductor substrate. A contact hole is formed by etching a portion of the interlay insulating layer. A heating electrode is formed in a lower portion of the contact hole and includes a smart heating layer that a resistivity is increased in proportion to a temperature. A phase change pattern is formed in an upper portion of the contact hole to be contacted with the heating electrode.

According to still another aspect of another exemplary embodiment, a phase change memory circuit includes a word line, a bit line arranged to be crossed to the word line, a switching device connected to the word line, a variable resistor formed of a phase change material and electrically connected to the switching device and the bit lines respectively, and a thermistor connected between the switching device and the variable resistor and configured to increase a resistivity thereof in proportion to a temperature.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements.

Figure 3:
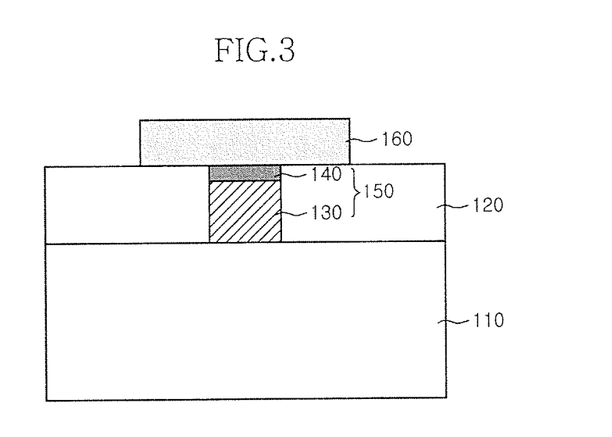
FIG. 3 is a sectional view of a phase change memory device according to an exemplary embodiment.

FIG. 3 is an essential sectional view of a phase change memory device according to an exemplary embodiment. Referring to FIG. 3, a heating electrode 150 which includes a smart heating layer 140 is formed within an interlayer insulating layer 120 on a semiconductor substrate 110. A phase change pattern 160 is also formed on the interlayer insulating layer 120 to be connected to the heating electrode 150.

The semiconductor substrate 110 may includes a word line of an active region type (not shown) and a switching device (not shown) electrically connected to the word line. The heating electrode 150 may include a conduction layer 130 and the smart heating layer 140 stacked on the conduction layer 130. The conduction layer 130 may be formed of a material having a relatively constant resistivity independent of temperature. For example, the conduction layer 130 for a heating electrode may be formed of titanium nitride (TiN), titanium-aluminum nitride (TiAlN), polysilicon or silicon germanium (SiGe).

The smart heating layer 140 may be formed of a PTC thermistor material having a resistivity which increases relative to an increase in the temperature. The PTC thermistor material of the smart heating layer 140 may comprise a titanium oxide-based material (e.g., $TiO_2$), a barium titanium oxide-based material (e.g., $BaTiO_3$), a copper oxide-based material (e.g., $CuO_x$) or a nickel oxide-based material (e.g., $NiO_x$). Herein, the smart heating layer 140 may be formed at a thickness corresponding to 1 to 20%, preferably 5 to 15% of a thickness of the conduction layer 130 for a heating electrode 150.

The heating electrode 150 including the heating layer 140 may be formed by the following process. First, a contact hole is formed in a portion of the interlayer insulating layer 120. Although not shown in drawings, the contact hole may expose an upper portion of a switching device which is formed within the semiconductor substrate 110.

Next, the conduction layer 130 for the heating electrode 150 is formed on the interlayer insulating layer 120 for filling in the contact hole. Afterwards the conduction layer 130 is etched back to be buried within the contact hole. At this time, the conduction layer 130 for a heating electrode is overetched back such that the conduction layer for a heating electrode has a height lower than the interlayer insulating layer 120. Accordingly, the conduction layer 130 is sunken in with the contact hole so that an upper portion of the contact hole is empty.

Next, the smart heating layer 140 is deposited on the conduction layer 130 within the contact hole to fill in the upper portion of the contact hole and then the smart heating layer 140 is planarized to expose a surface of the interlayer insulating layer, thereby completing the heating electrode 150. Next, the phase change pattern 160 is formed to be contacted with the smart heating layer 140 of the heating electrode 150.

At this time, the phase change pattern 160 may be formed of chalcogen compound as a phase change material layer. The phase change material layer may be formed of any one selected from the group consisting of germanium (Ge)-antimony (Sb)-tellurium (Te) (Ge—Sb—Te), nitrogen (N)-germanium (Ge)-antimony (Sb)-tellurium (Te) (N—Ge—Sb—Te), arsenic (As)-antimony (Sb)-tellurium (Te) (As—Sb—Te), germanium (Ge)-Bismuth (Bi)-tellurium (Te) (Ge—Bi—Te), tin (Sn)-antimony (Sb)-tellurium (Te) (Sn—Sb—Te), silver (Ag)-indium (In)-antimony (Sb)-tellurium (Te) (Ag—In—Sb—Te), gold (Au)-indium (In)-antimony (Sb)-tellurium (Te) (Au—In—Sb—Te), germanium (Ge)-indium (In)-antimony (Sb)-tellurium (Te) (Ge—In—Sb—Te), selenium (Se)-antimony (Sb)-tellurium (Te) (Se—Sb—Te), tin (Sn)-indium (In)-antimony (Sb)-tellurium (Te) (Sn—In—Sb—Te), arsenic (As)-germanium (Ge)-antimony (Sb)-tellurium (Te) (As—Ge—Sb—Te), As another example, the chalcogen compound may comprise 5A group element-antimony (Sb)-tellurium (Te) such as tantalum (Ta)-antimony (Sb)-tellurium (Te) (Ta—Sb—Te), niobium (Nb)-antimony (Sb)-tellurium (Te) (Nb—Sb—Te) or vanadium (V)-antimony (Sb)-tellurium (Te) (V—Sb—Te) or 5A group element-antimony (Sb)-selenium (Se) such as tantalum (Ta)-antimony (Sb)-selenium (Se) (Ta—Sb—Se), niobium (Nb)-antimony (Sb)-selenium (Se) (Nb—Sb—Se) or vanadium (V)-antimony (Sb)-selenium (Se) (V—Sb—Se). In addition, the phase change material may comprise 6A group element-antimony (Sb)-tellurium (Te) such as tungsten (W)-antimony (Sb)-tellurium (Te) (W—Sb—Te), molybdenum (Mo)-antimony (Sb)-tellurium (Te) (Mo—Sb—Te) or chromium (Cr)-antimony (Sb)-tellurium (Te) (Cr—Sb—Te) or 6A group element-antimony (Sb)-selenium (Se) such as tungsten (W)-antimony (Sb)-selenium (Se) (W—Sb—Se), molybdenum (Mo)-antimony (Sb)-selenium (Se) (Mo—Sb—Se) or chromium (Cr)-antimony (Sb)-selenium (Se)

(Cr—Sb—Se). The chalcogenide thin film may also include various dopants such as nitrogen (N) or oxide ($SiO_2$).

In addition, although not shown in drawings, the bit line is further formed over the phase change pattern 160 to be electrically connected to the phase change pattern 160.

Figure 4:
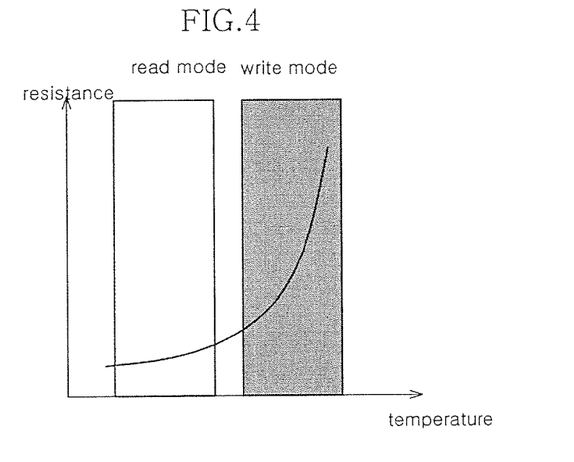
FIG. 4 is a graph showing a resistance distribution of a phase change pattern to a temperature of the phase change pattern in the exemplary embodiment.

The heating electrode 150 having the above structure includes the smart heating layer 140 that exhibits a temperature dependent resistivity that increases as the temperature increases. Accordingly the heating electrode 150 exhibits a low resistivity at a relatively low temperature and a higher resistivity at a relatively higher temperature, as shown in FIG. 4.

In particular, in case of a read mode which assesses a given solid state (e.g., an ordered crystalline solid state or a disordered amorphous solid state) of the phase change pattern 160, the magnitude of the read mode current is selected so as not to substantially heat the heating electrode 150. Accordingly, in the read mode, the smart heating layer 140 of the heating electrode 150 exhibits a low resistance.

Meanwhile, in case of a write mode which switches a crystalline state of the phase change pattern 160. That is, in case of a program mode, a relatively higher current, i.e., a reset current, should be provided to the phase change pattern 160 so as to drive up the temperature up to or even beyond the melting point (600 to 700° C.) of the phase change pattern 160. Accordingly, the heating electrode 150 is heated by the reset current. If the temperature of the heating electrode 150 reaches over a critical temperature of the PTC thermistor material, the resistivity of the smart heating layer 140 is abruptly raised. As a result, the total resistivity of the heating electrode 150 is abruptly raised, which further increases the amount of Joule heat. As a result, the requisite amount of heat needed to drive the phase change transition is created by a relatively smaller reset current with respects to not having a PTC thermistor material of the smart heating layer 140.

Figure 5:
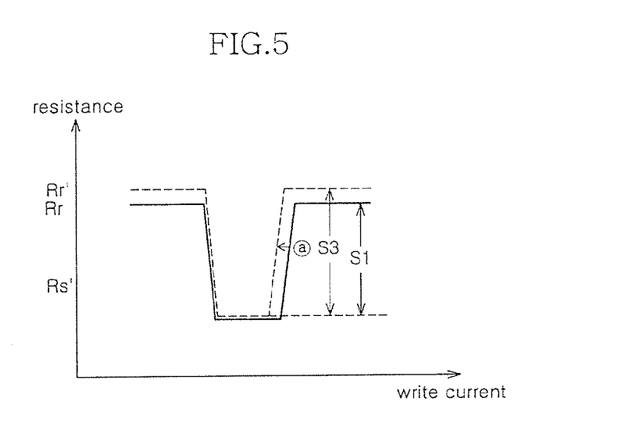
FIG. 5 is a graph showing a resistance of the phase change pattern to a write current in the exemplary embodiment.

According to this, as shown in FIG. 5, since the smart heating layer 140 which only increases the resistivity in a write mode, then the reset current ((a)) becomes reduced because the reset resistance Rr can be raised. In drawing, Rr' is used to designate the raising resistance associated with the reset current. Meanwhile, in the read mode, the smart heating layer 140 exhibits a relatively lower resistance such that the set resistance Rs does not change. According, an improved sensing margin S3 can be realized by the invention as compared to the sensing margin S1 of the conventional device that has no smart heating layer 140.

Figure 6:
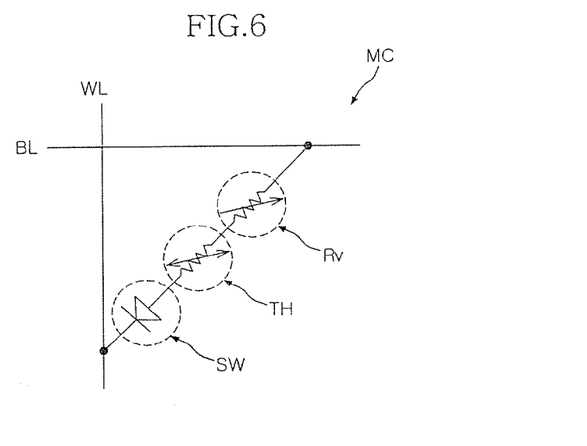
FIG. 6 is an equivalent circuit diagram of a phase change memory cell according to an exemplary embodiment.

A memory cell of the phase change memory device that has the smart heating layer 140 may be theoretically embodied as the equivalent circuit as shown in FIG. 6. The memory cell MC may comprise a word line WL and a bit line BL that cross each other, a switching device SW connected to the word line WL, a variable resistor Rv which is electrically connected to the switching device SW and to the bit line BL, respectively. The variable resistor Rv is composed of the phase change material. The thermistor TH is connected between the switching device SW and the variable resistor Rv.

The thermistor TH may be the smart heating layer 140 and when the switching device SW is driven by a selection of the word line WL, the requisite high temperature needed to drive the phase transition can be achieved by applying a relatively smaller current across the variable resistor Rv because the thermistor TH resistance increases which in turn boost the temperature and thus it is easier to drive the phase-change transition of the variable resistor Rv.

Figure 7:
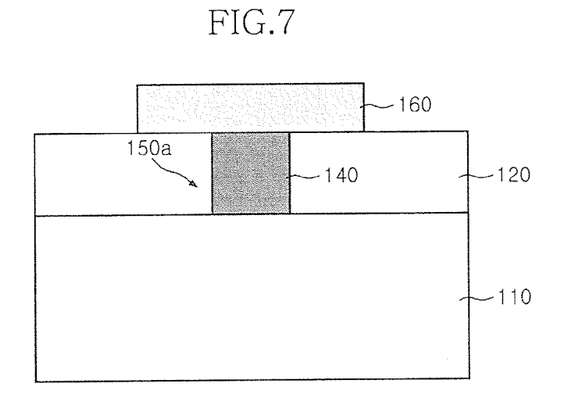
FIGS. 7 through 15 are sectional views of phase change memory devices according to another exemplary embodiment.

Meanwhile, as shown in FIG. 7, a heating electrode 150a may comprise only smart heating layer 140. The heating electrode 150a of the above structure may be formed by burying only the smart heating layer 140 within the contact hole of the interlayer insulating layer 120.

The heating electrode 150 may be modified in any number of various shapes so as to reduce the reset current. Some of these various shapes of the modified heating electrode 150 will be described with reference to FIGS. 8 through 12.

Figure 8:
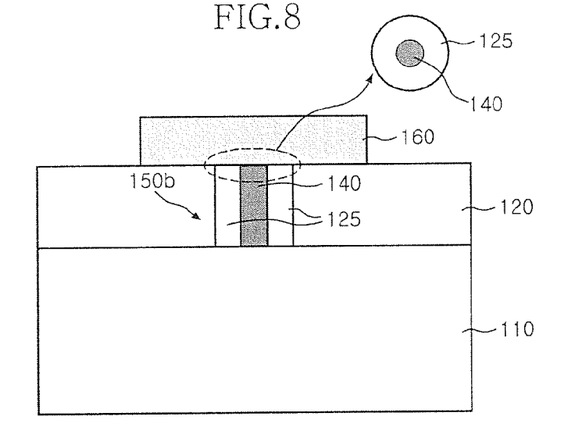

First, referring to FIG. 8, a heating electrode 150b may be formed of the smart heating layer 140 and a heat-resistant member 125 surrounding, i.e., encircling, the smart heating layer 140 within the contact hole. That is, the diameter of the smart heating layer 140 which substantially serves as a heating electrode can be reduced by a critical dimension (CD) of the heat-resistant member 125.

The heating electrode 150b may be formed by the following process. First, a heat-resistant insulating layer, for example a silicon nitride layer is coated within a contact hole of the interlayer insulating layer 120 which has a diameter of a exposure limit value level. Then it is anisotropically etched to expose a bottom of the contact hole such that a spacer 125 which is formed of the heat-resistant insulating layer is formed on an inner wall of the contact hole. According to this, the inner diameter of the contact hole is reduced by the CD of the spacer 125. Subsequently, the smart heating layer 140 is formed which fills in an the inner space of the contact hole surrounded by the spacer 125. The spacer 125 and the smart heating layer 140 are then chemical mechanical polished (CMP) to expose a surface of the interlayer insulating layer 120 such that the heating electrode 150b including the heat-resistant member 125 is formed.

In the exemplary embodiment, the diameter of the heating electrode 150b is not dependent on the photo lithography process resolution but rather is controlled by the deposition thickness of the heat-resistant member 125 such that the substantive contact area between the phase change pattern 160 and the heating electrode 150b can be reduced. In addition, referring to FIG. 9, a heating electrode 150c may comprise a stack structure 142 of the conduction layer 130 for a heating electrode having a temperature invariant resistivity and the smart heating layer 140 and a heat-resistant member 125 surrounding the stack structure 142. The above structure may also reduce the diameter of the stack structure 142 which substantially serves as a heating electrode by the heat-resistant member 125.

Figure 9:
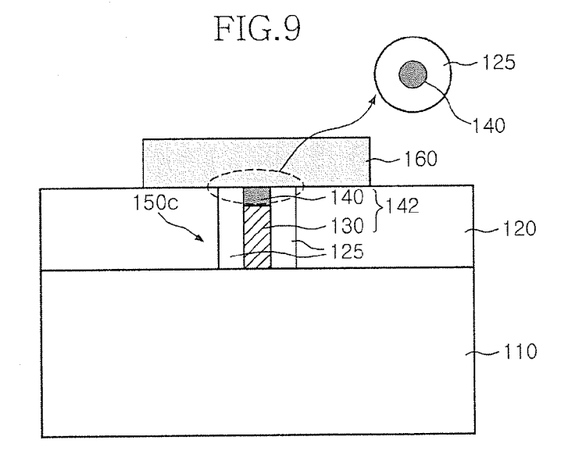

The heating electrode 150c of the exemplary embodiment may be formed by the following process. As above described, the spacer 125 formed of a heat-resistant insulating layer is formed on the inner wall of the contact hole and the conduction layer 130 for a heating electrode is formed to be filled within the inner space of the contact hole surrounded by the spacer 125. The conduction layer is over-etched back to have a height lower than the contact hole such that the upper portion of the inner space in the contact hole is empty. Subsequently, the smart heating layer 140 is filled within the upper portion of the inner space of the contact hole and then subsequently planarized to expose the surface of the interlayer insulating layer 120, thereby forming the heating electrode 150c having the heat-resistant member 125.

Similarly, in the heating electrode 150c, the CD of the stack structure 142 which substantially serves as the heating electrode 150c can be reduced below the exposure limit by the deposition thickness of the heat-resistant insulating layer constituting the heat-resistant member 125.

Figure 10:
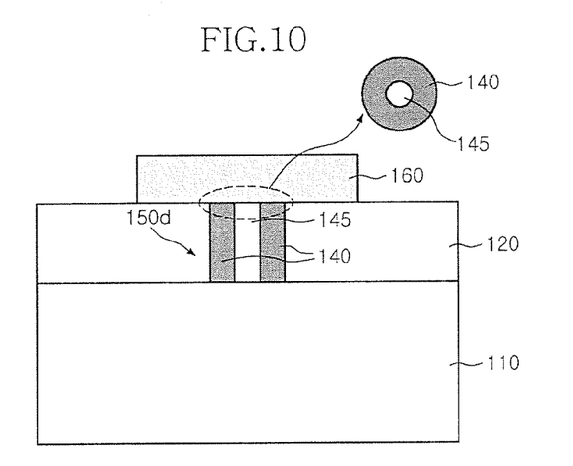

Referring to FIG. 10, a heating electrode 150d may be formed of a hollow cylinder type smart heating layer 140. That is, the smart heating layer 140 is conformally deposited on the surface of the interlayer insulating layer 120 in which a contact hole is formed therein. At this time, since the deposition thickness of the smart heating layer 140 determines the contact area between the phase change pattern 160 and the smart heating layer 140, it may be formed as thin as possible. In particular, the deposition technology in the semiconductor fabrication field can control the deposition thickness by several angstroms so that it forms the smart heating layer 140 at a desired thickness.

Next, the smart heating layer 140 is anisotropically etched to form the spacer type smart heating layer 140 on the inner wall of the contact hole. Subsequently, an insulating layer 145 is filled within an inner space of the contact hole surrounded by the smart heating layer 140 and then planarized to expose the surface of the interlayer is insulating layer 120, thereby completing the smart heating electrode 150d.

In the heating electrode 150d of the exemplary embodiment, a contact area between the heating electrode 150d and the phase change pattern 160 is determined by the deposition thickness of the smart heating layer 140 such that the contact area can be easily controlled.

Figure 11:
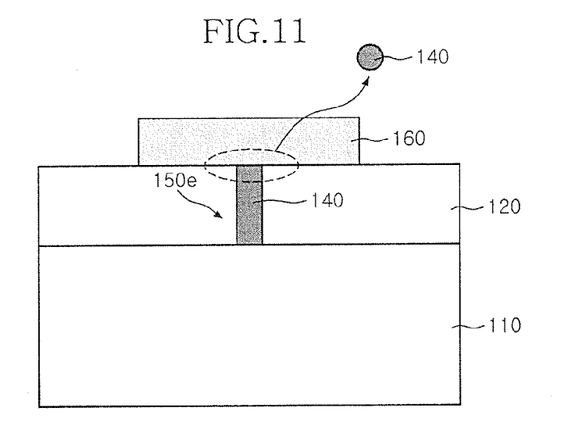

Meanwhile, as shown in FIG. 11, a heating electrode 150e may include the smart heating layer 140 of a fine line type. The fine line type smart heating layer 140 may be formed by using a double patterning method which performs the photo lithography twice.

Figure 12:
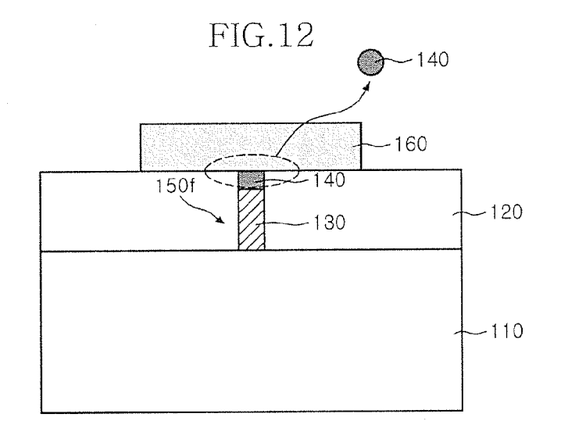

In addition, as shown in FIG. 12, a heating electrode 150f may be formed of a stack structure of the fine line type. The heating electrode 150f may be formed by sequentially depositing the conduction layer 130 for a heating electrode and the smart heating layer 140 on the semiconductor substrate 110 and etching them by using the double patterning method.

Figure 13:
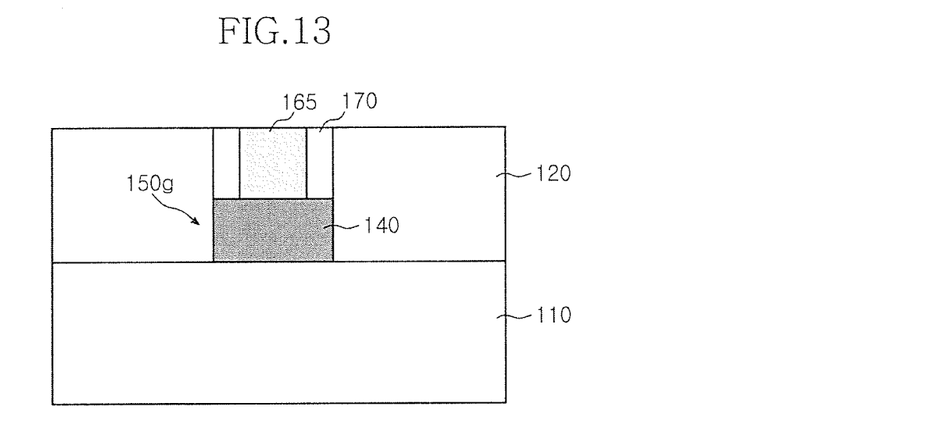
Figure 14:
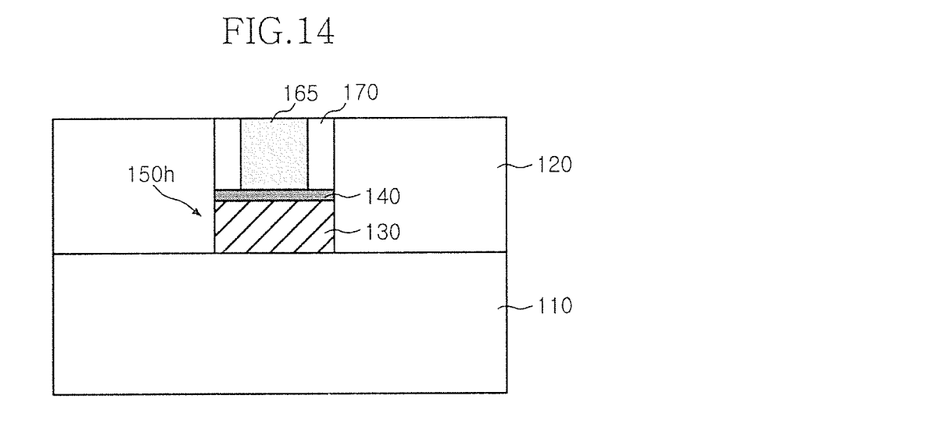
Figure 15:
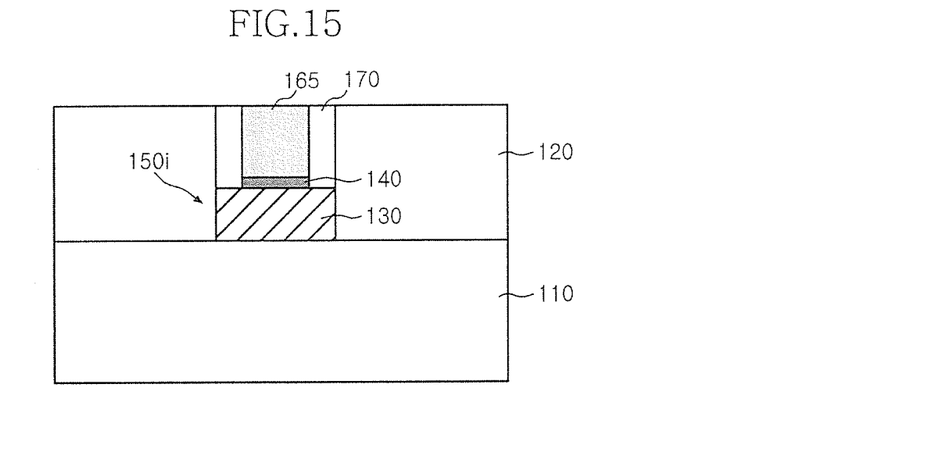

FIGS. 13 through 15 show confined type phase change memory devices that smart heating layers are adopted according to another exemplary embodiment.

Referring to FIG. 13, a heating electrode 150g and a phase change pattern 165 are formed within the contact hole. The structure that the phase change pattern 165 is confined within the predetermined space such as a contact hole as above is referred as the confined type. The confined type phase change memory device generates the volume variation of the phase change pattern 165 due to a phase-change within the confined space, thereby this embodiment provides a further reduction in the reset current needed to drive the phase change transitions.

The heating electrode 150g may be formed by the following method. First, the smart heating layer 140 is deposited to be filled within the contact hole by a desired thickness and over-etched to be filled within a portion of the contact hole, thereby burying the smart heating electrode 150g in a lower portion of the contact hole.

Next, an insulating layer is deposited on the smart heating layer 140 and the interlayer insulating layer 120 and then etched to be arranged on the sidewall of the contact hole, thereby forming an insulating spacer 170. Subsequently, a phase change material is filled within an inner space of the contact hole surrounded by the insulating spacer 170 to form the phase change pattern 165. According to this, all the heating electrode 150g and the phase shift pattern 165 are formed within the contact hole. In particular, the phase change pattern 165 is formed to have a narrower CD, e.g, narrower diameter, than the heating electrode 150g by the insulating spacer 170. Thereby this embodiment provides a further reduction in the reset current needed to drive the phase change transitions.

In addition, referring to FIG. 14, a heating electrode 150h may comprise a stack layer of the conduction layer 130 for a heating electrode and the smart heating layer 140 arranged within the contact hole below the confined phase change pattern 165.

As above described, the stack layer may be formed by filling the conduction layer 130 for a heating electrode within the lower portion of the contact hole, depositing the smart heating layer 140 on the conduction layer 130 for a heating electrode and then etching back the smart heating layer 140. At this time, the smart heating layer 140 may be formed to be thinner than the conduction layer 130 for a heating electrode. It may be formed at a thickness corresponding to 5 through 15% of the conduction layer 130 for a heating electrode. The stack layer buried within the contact hole should be formed to have a height lower than the contact hole.

In addition, as shown in FIG. 15, a heating electrode 150i may comprise the stack layer of the conduction layer 130 for a heat electrode and the smart heating layer 140, wherein the smart heating layer 140 may be arranged only below the phase change pattern 165.

In the phase change memory device as above, the conduction layer 130 for a heating electrode is filled within a lower portion of the contact hole and the insulating spacer 170 is formed as above described. Subsequently, the smart heating layer is deposited and etched back to form the smart heating layer 140 on the conduction layer 130 for a heating electrode within an inner space of an upper portion of the contact hole surrounded by the insulating layer 170. Then, the phase change pattern 165 is formed to be filled within the inner space of the contact hole.

As above described, according to the exemplary embodiment, the smart heating layer having a temperature dependent resistivity which increased as the temperature increase. The smart heating layer increases the resistivity of the heating electrode by the higher temperature generated due to the reset current in a write mode, thereby the amount of the reset current can be reduced. In addition, the smart heating layer has a lower resistivity in a read mode because a lower current is applied which sustains a low temperature. According to this, a reduction in the requisite reset current can be realized which also protects against a set resistance from rising. Thereby improvements in the sensing margin of the phase change memory device can be realized.

This inventive concept is limited to the above exemplary embodiments. For example, although the conduction layer 130 for a heating layer is formed of titanium nitride (TiN), titanium-aluminum nitride (TiAlN), polysilicon or silicon germanium (SiGe) in the exemplary embodiment, various conduction layers may be used for the conduction layer for a heating electrode.

In addition, although the smart heating layer is formed of a titanium oxide-based material (e.g., $TiO_2$), a barium titanium oxide-based material (e.g., $BaTiO_3$), a copper oxide-based material (e.g., $CuO_x$) or a nickel oxide-based material (e.g., NiOx) in the exemplary embodiment, any material that a relativity is increased in proportion to an increase of a temperature may be used for the smart heating layer.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A phase change memory device comprising:
   a phase change pattern; and
   a heating electrode contacted with the phase change pattern
      wherein the heating electrode includes a smart heating layer formed of at least one thermistor material that exhibits a positive temperature coefficient (PTC),
wherein the thermistor material of the smart heating layer is selected from the group consisting a copper oxide-based material, and a nickel oxide-based material,
wherein the heating electrode includes a conductive layer underneath the smart heating layer.

2. The phase change memory device of claim 1, wherein the PTC of the thermistor material of the smart heating layer is an increase in resistivity as the temperature increases.

3. The phase change memory device of claim 1, further comprising a heat-resistance member surrounding the smart heating layer in which the smart heating layer has a columnar shape.

4. The phase change memory device of claim 1, wherein the phase change pattern has a critical dimension (CD) which is larger than a diameter of the heating electrode.

5. The phase change memory device of claim 1, wherein the phase change pattern has a critical dimension (CD) which is smaller than a diameter of the heating electrode.

6. A phase change memory device, comprising:
a semiconductor substrate;
an interlayer insulating layer having a contact hole, the interlayer insulating layer formed on the semiconductor substrate;
a heating electrode buried within the contact hole, the heating electrode includes a positive temperature coefficient (PTC) thermistor material that exhibits a positive temperature dependent resistivity, wherein the thermistor material of the heating electrode is selected from the group of a copper oxide-based material, and a nickel oxide-based material; and
a phase change pattern contacted with the heating electrode, wherein the heating electrode includes:
a conduction layer having a constant resistivity relative to the temperature; and
the PTC thermistor material formed on the conduction layer.

7. The phase change memory device of claim 6, wherein the heating electrode further includes a heat-resistant member that encircles the PTC thermistor material within the contact hole.

8. The phase change memory device of claim 6, wherein the heating electrode further includes:
a conduction layer in the contact hole and underneath the PTC thermistor; and
a heat-resistant member that encircles the conduction layer and the PTC thermistor material within the contact hole.

9. The phase change memory device of claim 6, wherein the heating electrode is filled within a lower portion of the contact hole;
an insulating spacer is formed within an upper portion of the contact hole and formed above the heating electrode; and
the phase change pattern is filled within the upper portion of the contact hole and is encircled by the insulating spacer.

10. The phase change memory device of claim 9, wherein the heating electrode comprises:
a conduction layer having a resistivity invariant to the temperature; and
the PTC thermistor material stacked on top of the conduction layer.

11. The phase change memory device of claim 10, wherein the PTC thermistor material of the heating electrode has a diameter substantially the same as that of the phase change pattern.

12. A method of manufacturing a phase change memory device, comprising:
forming an interlayer insulating layer having a contact hole on a semiconductor substrate;
forming a heating electrode within the contact hole, the heating electrode including a smart heating layer exhibits a resistivity which positively increases as the temperature increases; and
forming a phase change pattern on the heating electrode,
wherein a material of the smart heating layer is selected from the group consisting of a copper oxide-based material, and a nickel oxide-based material, and
wherein the forming a heating electrode includes:
forming a conduction layer in the contact hole, the conduction layer having a resistivity invariant to the temperature;
over-etching the conduction layer in the contact hole to sink the conduction layer within the contact hole such that the conduction layer has a height lower than the interlayer insulating layer; and
forming the smart heating layer within the contact hole on top of the conduction layer.

13. The method of claim 12, wherein the forming the heating electrode includes:
forming a heat-resistant member around the contact hole; and
filling the smart heating layer within the contact hole so that the heat-resistant member encircles the smart heating layer.

14. The method of claim 12, wherein forming the heating electrode includes:
forming a heat-resistant member within and around the contact hole;
forming a conduction layer having a temperature invariant resistivity within the contact hole such that the conduction layer is encircled by the heat-resistant member so that the conduction layer has a height lower than the contact hole; and
burying the smart heating layer within the contact hole and on top of the conduction layer such that the smart heating layer is also encircled by the heat-resistant member.

15. A method of manufacturing a phase change memory device, comprising:
providing a semiconductor substrate;
forming a heating electrode layer including a smart heating layer on the semiconductor substrate, the smart heating layer of the heating electrode layer exhibits a positive increase to a resistivity as a temperature of the smart heating layer increases;
patterning the heating electrode layer to form a heating electrode having a line structure which has a diameter smaller than a photolithographic resolution; and
forming a phase change pattern that contacts the heating electrode,
wherein a material of the smart heating layer is PTC thermistor material, wherein the heating electrode layer comprises a conduction layer having a temperature invariant resistivity; and the smart heating layer stacked on top of the conduction layer.

* * * * *